US010403747B2

(12) United States Patent
Hurkx et al.

(10) Patent No.: US 10,403,747 B2
(45) Date of Patent: Sep. 3, 2019

(54) GALLIUM NITRIDE/ ALUMINUM GALLIUM NITRIDE SEMICONDUCTOR DEVICE AND METHOD OF MAKING A GALLIUM NITRIDE/ ALUMINUM GALLIUM NITRIDE SEMICONDUCTOR DEVICE

(71) Applicant: Nexperia B.V., Nijmegen (NL)

(72) Inventors: Godefridus Adrianus Maria Hurkx, Best (NL); Johannes Josephus Theodorus Marinus Donkers, Valkenswaard (NL); Jan Sonsky, Leuven (BE); Jeroen Antoon Croon, Waalre (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 15/356,509

(22) Filed: Nov. 18, 2016

(65) Prior Publication Data

US 2017/0154988 A1 Jun. 1, 2017

(30) Foreign Application Priority Data

Nov. 27, 2015 (EP) .................................... 15196730

(51) Int. Cl.
*H01L 29/778* (2006.01)
*H01L 29/20* (2006.01)
(Continued)

(52) U.S. Cl.
CPC ...... *H01L 29/7787* (2013.01); *H01L 29/2003* (2013.01); *H01L 29/401* (2013.01);
(Continued)

(58) Field of Classification Search
CPC ............. H01L 29/7787; H01L 29/2003; H01L 29/4236; H01L 29/41766; H01L 29/66462;
(Continued)

(56) References Cited

U.S. PATENT DOCUMENTS 9,331,155 B2 5/2016 Donkers et al.
9,391,187 B2 7/2016 Hurkx et al.
(Continued)

OTHER PUBLICATIONS

Extended European Search Report for Patent Appln. No. 15196730.4 (dated Jun. 9, 2016).
(Continued)

*Primary Examiner* — Thanh Y. Tran
(74) *Attorney, Agent, or Firm* — Ohlandt, Greeley, Ruggiero & Perle, L.L.P.

(57) ABSTRACT

A semiconductor device and a method of making the same is disclosed. The device includes a substrate having an AlGaN layer located on a GaN layer for forming a two dimensional electron gas at an interface between the AlGaN layer and the GaN layer. The device also includes a plurality of contacts. At least one of the contacts includes an ohmic contact portion located on a major surface of the substrate. The ohmic contact portion comprises a first electrically conductive material. The at least one of the contacts also includes a trench extending down into the substrate from the major surface. The trench passes through the AlGaN layer and into the GaN layer. The trench is at least partially filled with a second electrically conductive material. The second electrically conductive material is a different electrically conductive material to the first electrically conductive material.

13 Claims, 7 Drawing Sheets

(51) Int. Cl.

| | |
|---|---|
| ***H01L 29/423*** | (2006.01) |
| ***H01L 29/66*** | (2006.01) |
| ***H01L 29/872*** | (2006.01) |
| ***H01L 29/40*** | (2006.01) |
| ***H01L 29/417*** | (2006.01) |
| ***H01L 29/45*** | (2006.01) |

(52) U.S. Cl.
CPC .... *H01L 29/41766* (2013.01); *H01L 29/4236* (2013.01); *H01L 29/452* (2013.01); *H01L 29/66462* (2013.01); *H01L 29/7786* (2013.01); *H01L 29/872* (2013.01); *H01L 29/402* (2013.01); *H01L 29/423* (2013.01)

(58) Field of Classification Search
CPC . H01L 29/452; H01L 29/872; H01L 29/7786; H01L 29/401; H01L 29/402; H01L 29/423
See application file for complete search history.

(56) References Cited

U.S. PATENT DOCUMENTS

2008/0284022 A1 11/2008 Ehara
2011/0260216 A1* 10/2011 Hebert ................ H01L 21/8258 257/194
2013/0126893 A1 5/2013 Tanaka
2013/0134443 A1* 5/2013 Terano .................. H01L 29/205 257/77
2013/0248874 A1* 9/2013 Kuraguchi ........... H01L 29/778 257/76
2013/0271208 A1* 10/2013 Then ..................... H01L 25/072 327/541
2013/0313564 A1* 11/2013 Okada ................. H01L 21/8252 257/76
2014/0306232 A1 10/2014 Donkers et al.

OTHER PUBLICATIONS

Zhou, C. et al. “Self-protected GaN power devices with reverse drain blocking and forward current limiting capabilities”, In Proc. 22nd !International Symposium on Power Semiconductor Devices & IC’s (ISPSD), pp. 343-346 (2010).

Lin, M. E. et al. “Low resistance ohmic contacts on wide band-gap GaN”, App. Phys. Lett., vol. 64, No. 8, pp. 1003-1005 (Feb. 1994).

* cited by examiner

GALLIUM NITRIDE/ ALUMINUM GALLIUM NITRIDE SEMICONDUCTOR DEVICE AND METHOD OF MAKING A GALLIUM NITRIDE/ ALUMINUM GALLIUM NITRIDE SEMICONDUCTOR DEVICE

CROSS-REFERENCE TO RELATED APPLICATIONS

This application claims the priority under 35 U.S.C. § 119 of European Patent application no. 15196730.4, filed on Nov. 27, 2015, the contents of which are incorporated by reference herein.

BACKGROUND

The present specification relates to a semiconductor device and to a method of making a semiconductor device.

In recent years, GaN/AlGaN High Electron Mobility Transistors (HEMTs) and GaN/AlGaN Schottky diodes have drawn a lot of attention regarding their potential to replace Si or SiC for use as high voltage (HV) devices.

A GaN/AlGaN HEMT typically includes a substrate having an AlGaN layer located on a number of GaN layers. A gate, source and drain are located above the AlGaN layer. During operation, current flows between drain and source via a two-dimensional electron gas (2DEG) that is formed at the interface between the AlGaN layer and an upper GaN layer. Switch-off is achieved by applying a suitable voltage to the gate, such that the 2DEG at the interface between the AlGaN layer and the uppermost GaN layer disappears. The gate may be a Schottky contact or may comprise a gate electrode that is isolated by a dielectric layer (such devices are referred to as Metal Insulator Semiconductor High Electron Mobility Transistors (MISHEMTs).

A GaN/AlGaN Schottky diodes may be similarly constructed, but with two contacts (including a Schottky contact forming an anode and an ohmic contact forming a cathode of the device) instead of three.

Both the HEMT and the Schottky diode suffer from the problem that the on-state resistance under dynamic (e.g. switching, pulsed, RF) conditions may be significantly higher than under DC conditions.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a semiconductor device comprising:

- a substrate having an AlGaN layer located on a GaN layer for forming a two dimensional electron gas at an interface between the AlGaN layer and the GaN layer; and
- a plurality of contacts, wherein at least one of the contacts comprises:

- an ohmic contact portion located on a major surface of the substrate, wherein the ohmic contact portion comprises a first electrically conductive material; and
- a trench extending down into the substrate from the major surface, wherein the trench passes through the AlGaN layer and into the GaN layer, wherein the trench is at least partially filled with a second electrically conductive material, and wherein the second electrically conductive material is a different electrically conductive material to the first electrically conductive material.

According to another aspect of the present disclosure, there is provided a method of making a semiconductor device, the method comprising:

- providing a substrate having an AlGaN layer located on a GaN layer for forming a two dimensional electron gas at an interface between the AlGaN layer and the GaN layer; and
- forming a plurality of contacts of the device, wherein forming at least one of said contacts comprises:

- depositing a first electrically conductive material on a major surface of the substrate to form an ohmic contact portion;
- forming a trench extending down into the substrate from the major surface, wherein the trench passes through the AlGaN layer and into the GaN layer; and
- at least partially filling the trench with a second electrically conductive material, wherein the second electrically conductive material is a different electrically conductive material to the first electrically conductive material.

The provision of a contact having a trench that extends down into the GaN layer of the device can provide a leakage path for holes in the GaN layer to exit the device through the contact, which may lower the on state resistance of the device under dynamic (e.g. switching, pulsed, RF) conditions. This leakage path can short a pn-junction formed between the two dimensional electron gas ("2DEG") and the GaN layer.

In accordance with embodiments of this disclosure, the first and second electrically conductive materials are different materials, and they may be chosen independently to optimise the performance of the contact of the device. The first electrically conductive material may be chosen to make a good ohmic contact. The second electrically conductive material that at least partially fills the trench may be chosen so that it forms a low resistance contact with the GaN layer. In this respect, it is noted that a material that makes a good ohmic contact may be suitable for use as the first electrically conductive material, but may not be suitable for use as the second electrically conductive material, as it may form a local $n^+$ region around the trench. This $n^+$ region may form a reverse biased pn junction with the p-type GaN layer located around the trench, presenting a barrier to the flow of holes. Similarly, an electrically conductive material that is suitable for forming a low resistance path for holes may not be suitable for forming an ohmic contact portion of the device.

In some embodiments, the at least one contact may have a resistivity lower than approximately 1e9 Ω.mm. Using a typical width of the trench of 1 μm, this requirement is equivalent to a specific contact resistance lower than 10 $\Omega cm^2$.

In one embodiment, the at least one contact may include a central part aligned with the trench. This central part may be at least partially filled with the second electrically conductive material. The central part may be substantially surrounded by the ohmic contact portion when viewed from above the major surface. Such a contact may be conveniently manufactured in a manner that allows alignment of the trench relative to the ohmic contact portion (e.g. for producing a substantially symmetrical contact). For instance, a contact of this kind may be manufactured by initially depositing the first electrically conductive material of the ohmic contact portion, and then removing at least part of the first electrically conductive material to form an opening in the ohmic contact portion. The opening may expose a part of the major surface beneath the contact. The method may further include forming a trench in the part of the major surface that is exposed by the opening in the ohmic contact portion. The trench and the opening in the ohmic contact portion may then be at least partially filled with the second electrically conductive material. In some examples, the second electrically conductive material take the form of a layer that lines the trench. The layer of the second electrically conductive material may also line the opening in the ohmic contact portion. In such examples, a further electrically conductive material (e.g. Al) may be used to fill the remainder of the trench and/or the opening in the ohmic contact portion.

A single contiguous portion of the second electrically conductive may material form the central part and at least partially fill the trench. This may allow for an uninterrupted path for holes between the GaN layer and the top of the contact. The single contiguous portion may take the form of a layer as noted above, or alternatively may completely fill the trench and the central part.

In some examples, the substrate may further include a GaN cap layer located on the AlGaN layer. The trench of the at least one contact may pass through the GaN cap layer.

The device may be a High Electron Mobility Transistor (HEMT) comprising a gate contact located between a source contact and a drain contact. The at least one of the contacts may be a drain contact of the HEMT. The HEMT may have a Schottky gate contact or may be a MISHEMT having an insulated gate. In other examples, the device may be a Schottky diode and the at least one of the contacts may be a cathode of the Schottky diode. The gate contact of the HEMT or the anode of the Schottky diode may comprise the second electrically conductive material. This may allow the number of deposition steps required to manufacture the device to be reduced, since a single deposition step may be used to form the gate or anode of the HEMT or Schottky diode and the second electrically conductive material that at least partially fills the trench.

In some examples, at least one island may be located between the drain contact and the gate contact. Each island may include a trench extending down into the substrate from the major surface. The trench may pass through the AlGaN layer and into the GaN layer. The trench may be at least partially filled with the second electrically conductive material. The islands may provide additional paths for holes to exit the device. Since the trenches of the islands may be at least partially filled with the second electrically conductive material, the generation of a reverse biased pn junction of the kind described above, which may otherwise form a significant barrier to the flow of holes out of the device from the GaN layer, may be avoided. The islands may be connected to the drain contacts of the device. The islands may be formed during manufacture of the device by forming one or more trenches extending down into the substrate from the major surface, wherein each trench passes through the AlGaN layer and into the GaN layer. A deposition step may then be used to at least partially fill each trench with the second electrically conductive material.

The first electrically conductive material may be an alloy of Ti/Al. The second electrically conductive material may be Ni, Pd, Pt or TiWN (in which the amount of N may be varied).

A device of the kind described herein may be used for Radio Frequency applications. For the purposes of this disclosure, Radio Frequencies (RF) are frequencies in the range 200 MHz≤f≤10 GHz.

For power switching operations, the operating frequency of a device of the kind described herein may be in the range 10 kHz≤f≤10 MHz.

For the purposes of this disclosure, the electron mobility in a High Electron Mobility Transistor (HEMT) may be in the range 1000-3000 cm^2/V/s or in the range 1000-2000 cm^2/V/s.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
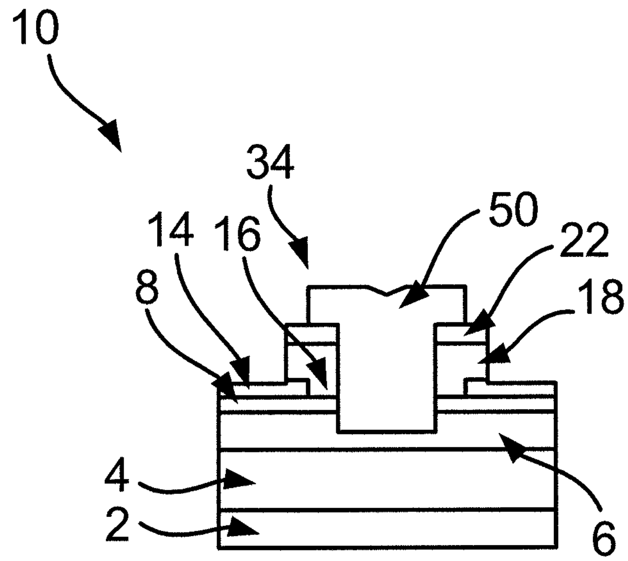
FIG. 1 shows a semiconductor device according to an embodiment of this disclosure.

FIG. 1 shows a semiconductor device 10 according to an embodiment of this disclosure.

The device includes a substrate 2. The substrate 2 may, for instance, be a silicon substrate, although it is also envisaged that the substrate 2 may comprise a ceramic, glass, SiC or sapphire. The substrate 2 has an AlGaN layer 8 located on a GaN layer 6. In use, a two dimensional electron gas or "2DEG" forms at an interface between the AlGaN layer and the GaN layer. Conduction of a current within the 2DEG forms the basis of operation of the device 10.

In this example, a number of buffer layers 4 comprising e.g. GaN and AlGaN may be located between the GaN layer and the underlying part of the substrate 2. These buffer layers 4 may form a super lattice acting as a stress relief region between the GaN layer 6 and the underlying part of the substrate 2.

In some examples, a GaN cap layer may be located on the AlGaN layer 8 (not shown in the Figures). A dielectric layer 14 may be provided on the AlGaN layer 8 (or on the GaN cap layer, if one is present). This dielectric layer may act as a passivation layer and/or may form a gate dielectric for the device 10 in the case of a MISHEMT. The dielectric layer 14 may, for instance, comprise SiN, SiOx or AlOx.

The device 10 includes a plurality of contacts, one of which is shown in FIG. 1. The device 10 may be a High Electron Mobility Transistor (HEMT) having a source contact, a drain contact and a gate contact. The gate contact of the HEMT may be a Schottky contact, or alternatively may be an insulated gate (accordingly, the HEMT may be a Metal Insulator Semiconductor High Electron Mobility Transistor (MISHEMT)). The contact 34 shown in FIG. 1 may be a drain contact of the HEMT. In other examples, the device 10 may be a Schottky diode having an anode and a cathode. The contact 34 shown in FIG. 1 may be a cathode of the Schottky diode, the anode of the Schottky diode being formed of a Schottky contact.

The contact 34 shown in FIG. 1 includes an ohmic contact portion 18. The ohmic contact portion 18 may be located on a major surface of the substrate 2. For instance, the ohmic contact portion 18 may be located on a surface of the AlGaN layer 8 (as is shown in FIG. 1) or may be located on the surface of a GaN cap layer on the AlGaN layer 8, if one is present. The ohmic contact portion 18 may make a good ohmic contact to allow current flowing within the 2DEG at the interface between the AlGaN layer 8 and the GaN layer 6 to enter and/or exit the device 10 through the contact 34.

The ohmic contact portion 18 comprises a first electrically conductive material that may be located on the major surface of the substrate 2. In some examples, it is envisaged that the contact 34 may be a recessed contact, in which the ohmic contact portion 18 extends through an opening in the AlGaN layer 8, thereby to directly contact the underlying GaN layer 6.

A layer 22 may be located on the ohmic contact portion 18. The first electrically conductive material of the ohmic contact portion 18 may, for instance, comprise Ti/Al. The layer 22 may, for instance, comprise TiW(N). The layer 22 may function as a diffusion barrier during manufacture of the device 10.

The contact 34 also includes a trench. The trench may extend down into the substrate 2 of the device 10 from the major surface upon which ohmic contact portion 18 is located (e.g. this may be the surface of the AlGaN layer 8 or the surface of a GaN cap layer, if one is present). In particular, and as shown in the example of FIG. 1, the trench passes through the AlGaN layer 8 (and any GaN cap layer) and into the GaN layer 6. This may allow the material filling the trench (as described below) to make direct contact with the GaN layer 6, for allowing holes located in the GaN layer 6 to pass freely into the contact 34. In the present example, the trench extends only partially into the GaN layer 6, although it is also envisaged that the trench may extend through the GaN layer 6 (e.g. to extend into the layers 4).

The trench is at least partially filled with a second electrically conductive material 50. The second electrically conductive material 50 may also at least partially fill (or, as shown in FIG. 1, completely fill) a central part of the contact 34 that is substantially surrounded by the ohmic contact portion. As will be described below, the configuration and location of the central part of the contact 34 may allow for convenient manufacture of the device 10. A portion of the second electrically conductive material 50 may be located above the ohmic contact portion 18. For instance, in the example of FIG. 1, a portion of the electrically conductive material 50 extends over an upper surface of the layer 22.

The trench that extends down into the GaN layer 6 of the device 10 can provide a leakage path for holes in the GaN layer 6 to exit the device 10 through the contact 34, which may lower the on state resistance of the device under dynamic (e.g. switching, pulsed, RF) conditions. This leakage path may short a pn junction formed between the two dimensional electron gas ("2DEG") and the GaN layer 6. Moreover, in accordance with embodiments of this disclosure, the second electrically conductive material 50, which at least partially fills the trench, may be chosen so that a pn-junction is not formed at an interface between the second electrically conductive material 50 and the GaN of the GaN layer 6 (e.g. at the sidewalls and/or base of the trench). Such a pn junction may otherwise hinder the connection between the contact 34 and GaN of the GaN layer 6, inhibiting the flow of holes exiting the device 10 through the contact 34. Accordingly, the second electrically conductive material 50 may be chosen so as to lower the on state resistance of the device under dynamic (e.g. switching, pulsed, RF) conditions.

The second electrically conductive material is a different electrically conductive material to the first electrically conductive material. These materials may be chosen independently, to optimise the performance of the contact 34 of the device 10.

The first electrically conductive material, which forms the ohmic contact portion 18 may be chosen according to its suitability to make a good ohmic contact to the 2DEG. On the other hand, the second electrically conductive material 50 that at least partially fills the trench may be chosen so that it forms a low resistance contact with the GaN layer 6 (in particular, it may be chosen such that a pn junction may not form at the interface between the second electrically conductive material 50 and the GaN of the GaN layer 6, as noted above).

A material that makes a good ohmic contact may be suitable for forming the ohmic contact portion, but may not be suitable for use as the second electrically conductive material, as it may form a local $n^+$ region in the part of the GaN layer 6 that surrounds the trench. This $n^+$ region may form a reverse biased pn junction with the GaN layer 6 (which is p-type). The pn junction may surround the trench, thereby presenting a barrier to the flow of holes, as noted previously. Similarly, an electrically conductive material that is suitable for forming a low resistance path for holes to enter the contact 34 from the GaN layer 6 through the trench may not be suitable for forming the ohmic contact portion of the device 34.

As noted above, the first electrically conductive material, which may form the ohmic contact portion 18, may comprise an alloy of Ti/Al. This electrically conductive material is suited to the formation of an ohmic contact. However, were this material to be used to fill the trench of the contact 34, a reverse biased pn junction of the kind described above would form, presenting a barrier to the flow of holes into the contact 34. In accordance with an embodiment of this disclosure, the second electrically conductive material 50 may comprise Ni, Pd, Pt or TiW(N).

Figure 2:
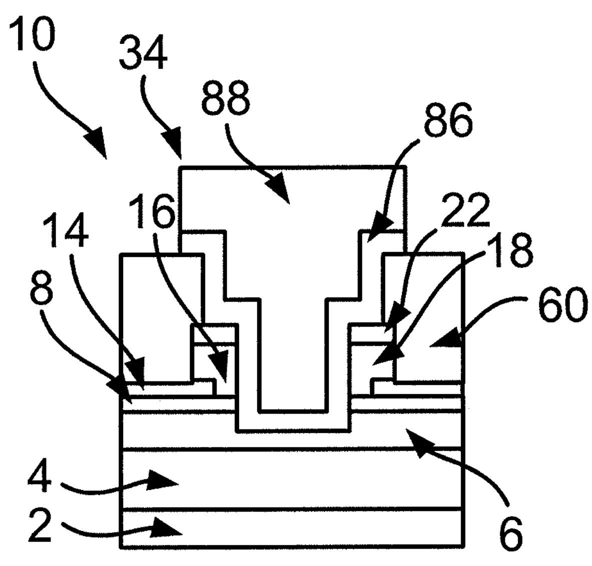
FIG. 2 shows a semiconductor device according to another embodiment of this disclosure.

FIG. 2 shows a semiconductor device 10 according to another embodiment of this disclosure. The device in FIG. 2 is similar in some respects to the device 10 shown in FIG. 1, and only the differences will be described in detail here.

As shown in FIG. 2, the contact 34 includes a trench that is at least partially filled with a second electrically conductive material. In this example, the second electrically conductive material 86 is provided in the form of a layer 86 that lines the trench. As shown in FIG. 2, the layer 86 may also line sidewalls of an opening in the central part of the ohmic contact portion 18. The layer 86 of the second electrically conductive material may, in some examples, form a diffusion barrier elsewhere in the device 10 and/or may form part of a field plate elsewhere in the device 10, as will be explained below in relation to FIG. 4D. In the present embodiment, the second electrically conductive material comprises TiW(N), although as already noted above, other materials, such as Ni, Pd or Pt are envisaged. In this example, a third electrically conductive material 88 may also be provided, for filling the part of the trench and/or central part of the contact 34 that is not filled with the second electrically conductive material. The third electrically conductive material may, for instance, comprise Al.

The example contact 34 in FIG. 2 may also be a recessed contact as noted above in relation to FIG. 1, in which the ohmic contact portion 18 extends through an opening in the AlGaN 8 layer, thereby to directly contact the underlying GaN layer 6.

The example in FIG. 2 may also include a dielectric layer 60, the composition and purpose of which will be described below in relation to FIGS. 4A to 4D.

FIGS. 3A to 3D show a method of making a semiconductor device according to an embodiment of this disclosure. In this example, the device 10 comprises a HEMT having a Schottky gate contact, although it will be appreciated that processes similar to that described here may also be used to form a MISHEMT or Schottky diode. The method of FIGS. 3A to 3D may be used to make a device 10 including at least one contact of the kind shown in, for instance, FIG. 1. In this example, the contact of FIG. 1 forms a drain contact 34 of the device 10 to be manufactured.

Figure 3A:
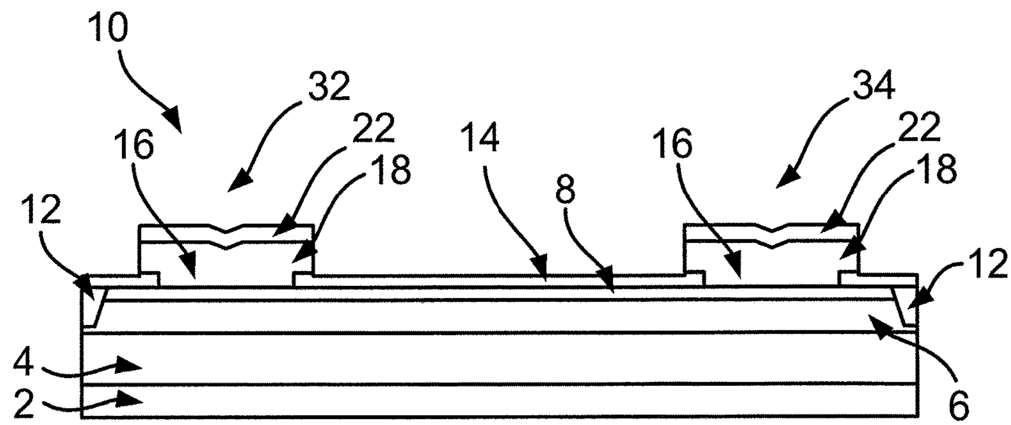
FIGS. 3A to 3D show a method of making a semiconductor device incorporating a contact of the kind shown in FIG. 1.

In a first step, as shown in FIG. 3A, the method may include providing a substrate 2. The substrate 2 may be of the kind described above in relation to FIG. 1.

The substrate 2 may, for instance, be a silicon substrate, although it is also envisaged that the substrate 2 may comprise a ceramic or glass. The substrate 2 has an AlGaN layer 8 located on a GaN layer 6. A number of buffer layers 4 comprising GaN may be located between the GaN layer and the underlying part of the substrate 2. As noted previously, these buffer layers 4 may form a super lattice that matches the lattice of the GaN layer 6 to underlying part of the substrate 2. In some examples, a GaN cap layer may be located on the AlGaN layer 8 (not shown in the Figures). In the present example, isolation regions 12 (e.g. trenches filled with dielectric or implanted regions) are provided for isolating the HEMT from other electrical devices on the substrate 2.

A dielectric layer 14 may be deposited on a major surface of the substrate, e.g. on a surface of the AlGaN layer 8 or any GaN cap layer that may be provided on the AlGaN layer 8. As noted previously, the dielectric layer 14 may act as a passivation layer. The dielectric layer 14 may comprise, for instance, SiN, SiOx or AlOx.

Next, openings 16 may be formed in the dielectric layer 14. These openings 16 may allow access to the underlying layers, such as the AlGaN layer 8 for the source and drain contacts of the device. The openings 16 may be formed by etching.

After formation of the opening 16, a first electrically conductive material may be deposited and patterned to form the ohmic contact portion 18 of a source contact 32 and a drain contact 34 of the device 10. This step may also include depositing and patterning layers 22 on the source contact 32 and drain contact 34, which may act as a diffusion barrier. As noted previously, the first electrically conductive material that forms the ohmic contact portion 18 of the source contact 32 and the drain contact 34 may comprise, for instance, comprise Ti/Al, while the layers 22 of the source contact 32 and the drain contact 34 may, for instance, comprise TiW (N).

Figure 3B:
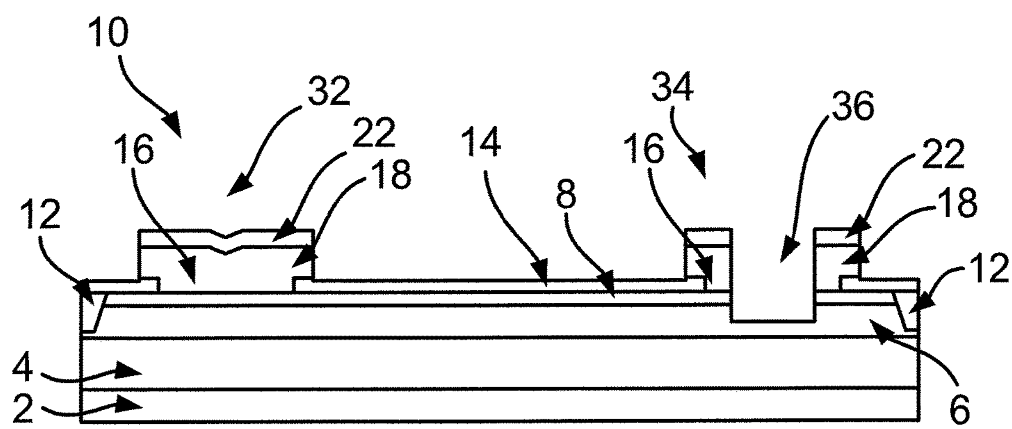

In a next step, shown in FIG. 3B, a masking and etching step (e.g. a dry etch) may be used to etch a trench 36 in the drain contact 34. The trench 36 may be located in a central part of the drain contact 34. The trench 36 may extend through the ohmic contact portion 18 and the layer 22. The trench 36 extends through the AlGaN layer 8 and any GaN cap layer that may be located on the AlGaN layer 8. The trench 36 further extends into the GaN layer 6.

Figure 3C:
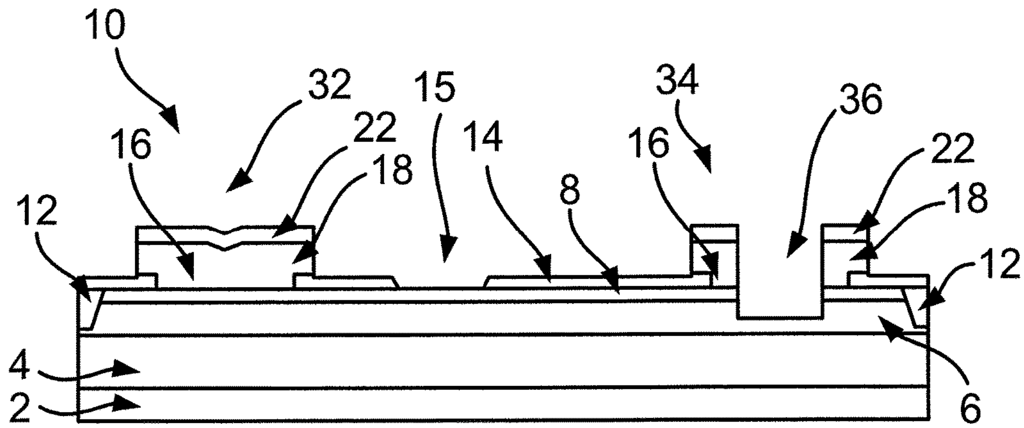

In a next step shown in FIG. 3C, a further opening 15 may be formed (e.g. by etching) in the dielectric layer 14, to allow a Schottky gate contact of the device 10 to be formed. The opening 15 may be located between the source contact 32 and the drain contact 34 on the major surface of the substrate 2.

Figure 3D:
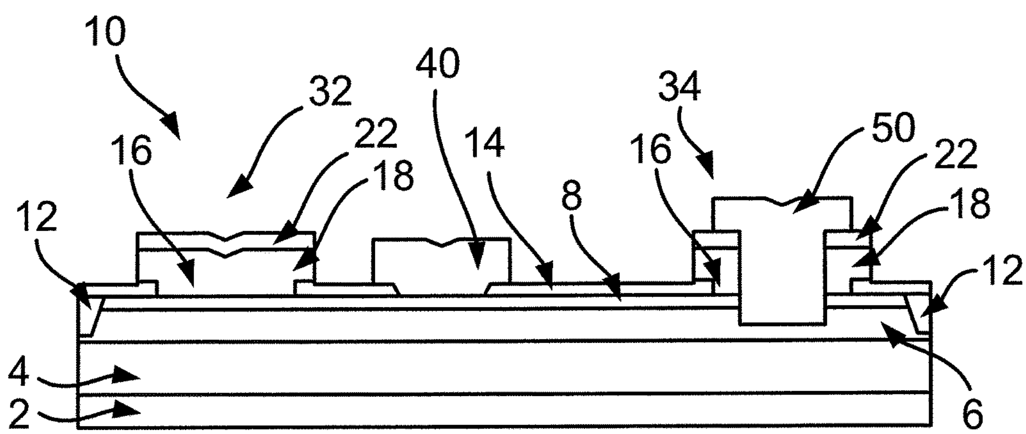

In a next step shown in FIG. 3D, a second electrically conductive material may be deposited and patterned. As noted previously, the second electrically conductive material may, for instance, comprise Ni, Pd, Pt or TiW(N).

The deposition and patterning of the second electrically conductive material may result in a drain contact 34 that is of the kind described above in relation to FIG. 1. In the present example, the second electrically conductive material is also used to form the Schottky gate electrode 40 of the HEMT of the device 10. In this way, the of process steps required to manufacture the device 10 may be reduced, since separate deposition steps need not be provided for forming the second electrically conductive material 50 of the contact 34 and the Schottky gate electrode 40. Nevertheless, if it is still desired to use a different electrically conductive materials for the Schottky gate electrode 40 and the contact 34, then different deposition step may still be used.

FIGS. 4A to 4D show a method of making a semiconductor device according to another embodiment of this disclosure. In this example, the device 10 comprises a HEMT having a Schottky gate contact, although it will be appreciated that processes similar to that described here may also be used to form a MISHEMT or Schottky diode. The method of FIGS. 4A to 4D may be used to make a device 10 including at least one contact of the kind shown in, for instance, FIG. 2. In this example, the contact of FIG. 2 forms a drain contact 34 of the device 10 to be manufactured.

Figure 4A:
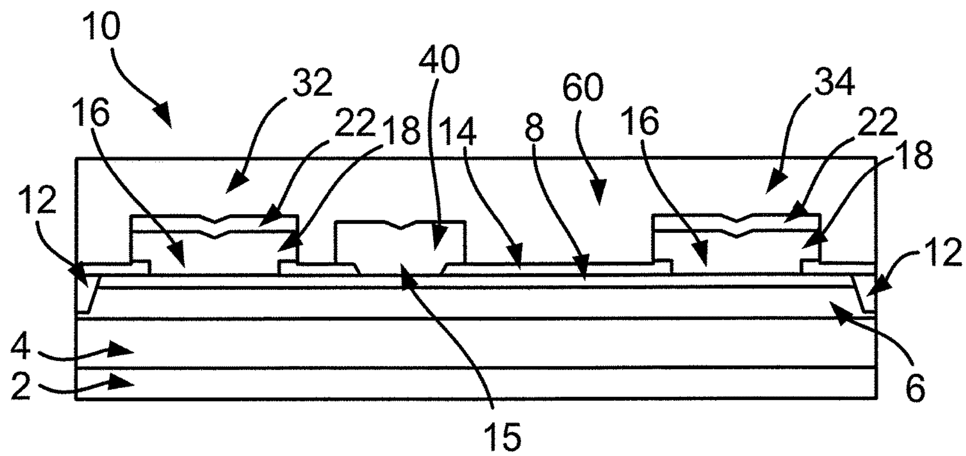
FIGS. 4A to 4D show a method of making a semiconductor device incorporating a contact of the kind shown in FIG. 2.

In a first step, as shown in FIG. 4A, the method may include providing a substrate 2. The substrate 2 may be of the kind described above in relation to FIGS. 1 to 3.

The substrate 2 may, for instance, be a silicon substrate, although it is also envisaged that the substrate 2 may comprise a ceramic or glass. The substrate 2 has an AlGaN layer 8 located on a GaN layer 6. A number of buffer layers 4 comprising GaN may be located between the GaN layer and the underlying part of the substrate 2. As noted previously, these buffer layers 4 may form a super lattice that matches the lattice of the GaN layer 6 to underlying part of the substrate 2. In some examples, a GaN cap layer may be located on the AlGaN layer 8 (not shown in the Figures). In the present example, the substrate 2 includes isolation regions 12 (e.g. trenches filled with dielectric) for isolating the HEMT from other parts of the substrate 2.

A dielectric layer 14 may be deposited on a major surface of the substrate, e.g. on a surface of the AlGaN layer 8 or any GaN cap layer that may be provided on the AlGaN layer 8. As noted previously, the dielectric layer 14 may act as a passivation layer. The dielectric layer 14 may comprise, for instance, SiN, SiOx or AlOx.

Next, openings 16 may be formed in the dielectric layer 14. These openings 16 may allow access to the underlying layers, such as the AlGaN layer 8 for the source and drain contacts of the device. The openings 16 may be formed by etching.

After formation of the opening 16, a first electrically conductive material may be deposited and patterned to form the ohmic contact portions 18 of a source contact 32 and a drain contact 34 of the device 10. This step may also include depositing and patterning layers 22 on the source contact 32 and drain contact 34. As noted previously, the first electrically conductive material that forms the ohmic contact portions 18 of the source contact 32 and the drain contact 34 may comprise, for instance, comprise Ti/Al, while the layers 22 of the source contact 32 and the drain contact 34 may, for instance, comprise TiW(N).

Next, a further opening 15 may be formed (e.g. by etching) in the dielectric layer 14, to allow a Schottky gate contact of the device 10 to be formed. The opening 15 may be located between the source contact 32 and the drain contact 34 on the major surface of the substrate 2. After the opening 15 is formed, an electrically conductive material may be deposited and patterned to form the Schottky gate contact 40 of the HEMT. The electrically conductive material of the Schottky gate contact 40 may, for instance, comprise Ni.

Next a dielectric layer 60 may be deposited, e.g. by Plasma Enhanced Chemical Vapour Deposition (PECVD). The layer 60 may, for instance, comprise SiN. The layer 60 may have a thickness of around 100 nm.

Figure 4B:
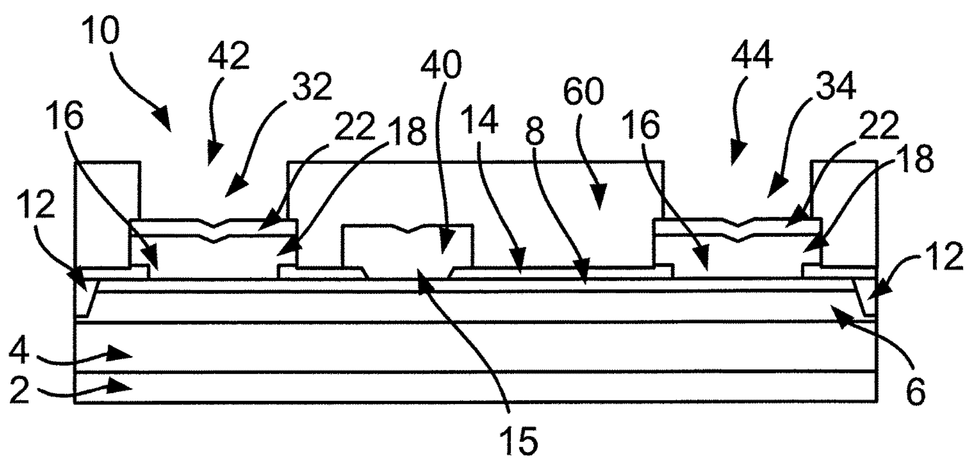

In a next step shown in FIG. 4B, openings 42, 44 may be formed (e.g. by etching) in the layer 60, to obtain access to the underlying source contact 32 and the drain contact 34.

Figure 4C:
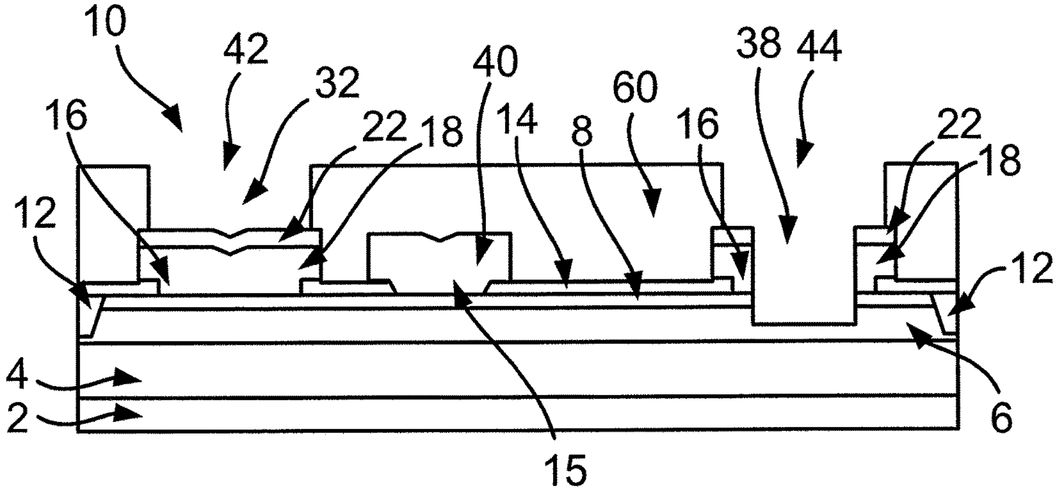

In a next step shown in FIG. 4C, a masking and etching step (e.g. a dry etch) may be used to etch a trench 38 in the drain contact 34. The trench 38 may be located in a central part of the drain contact 34. The trench 36 may extend through the ohmic contact portion 18 and the layer 22. The trench 36 may further extend through the AlGaN layer 8 and any GaN cap layer that may be located on the AlGaN layer 8. The trench 36 may further extend into the GaN layer 6.

In a next step, a layer 86 of a second electrically conductive material may be deposited. In this example, the second electrically conductive material comprises TiW(N), although in other examples, the second electrically conductive material may, for instance, comprise Ni, Pd or Pt. The layer 86 of the second electrically conductive material may have a thickness of around 100 nm. The layer 86 of the second electrically conductive material may line the trench 38 and/or sidewalls of the central part of the contact. The layer 86 may also cover an upper surface of the layer 22 of the drain contact 34. The layer 86 may further cover an upper surface of the layer 22 of the source contact 32 and an upper surface of the layer 60.

Thereafter, a third electrically conductive material 88, such as Al, may be deposited on the layer 86. In some examples, around 1 μm of the third electrically conductive material may be deposited on the layer 86. Note that in the present example, the Schottky gate electrode 40 may be of a different material to the second electrically conductive material.

Figure 4D:
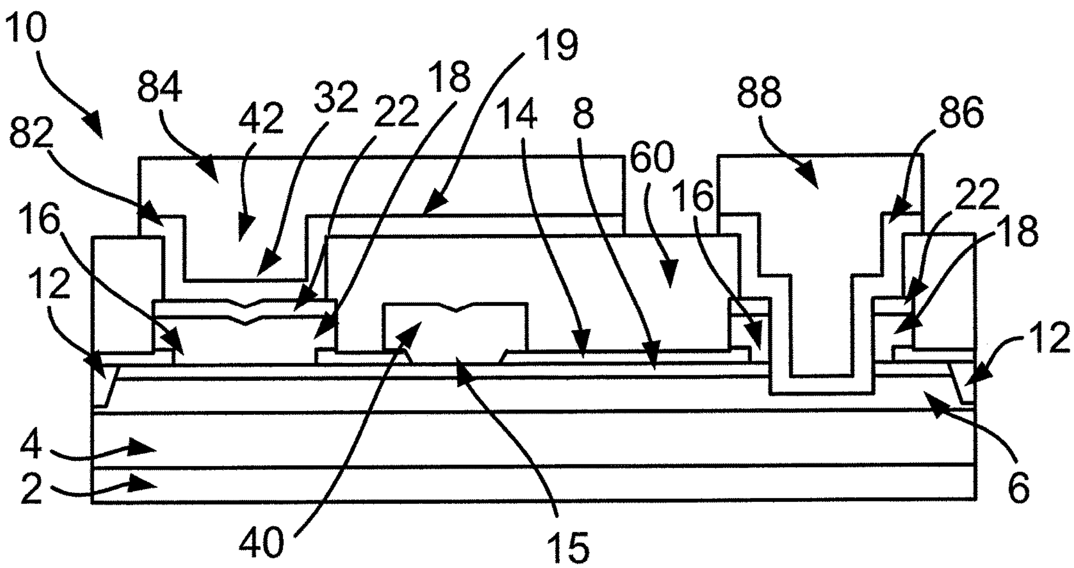

After the second and third electrically conductive materials have been deposited, they may be patterned to result in the structure shown in FIG. 4D. The second electrically conductive material may thus form a layer 86 that lines the trench in the drain contact 34 and may also form a layer 82 that covers an upper surface of the layer 22 of the source contact 32. A part 19 of the layer 82 may extend above the gate. The layer 82 may itself be covered by a portion 84 of the third electrically conductive material. The part 19 of the layer 82, and the overlying portion 84 may thus faun a source field plate for the device 10. Note that the structure of the drain contact 34 in FIG. 4D is of the kind described above in relation to FIG. 2. Note that the dielectric layer 60 may serve to separate and isolate the part 19 of the layer 82 and the overlying portion 84 from the underlying parts of the device 10, such as the gate contact 40.

FIGS. 5A to 5D show a method of making a semiconductor device according to a further embodiment of this disclosure. In this example, the device 10 comprises a HEMT having a Schottky gate contact, although it will be appreciated that processes similar to that described here may also be used to form a MISHEMT or Schottky diode. In this example, the contact of the HEMT that includes a trench of the kind described herein is the drain contact.

Figure 5A:
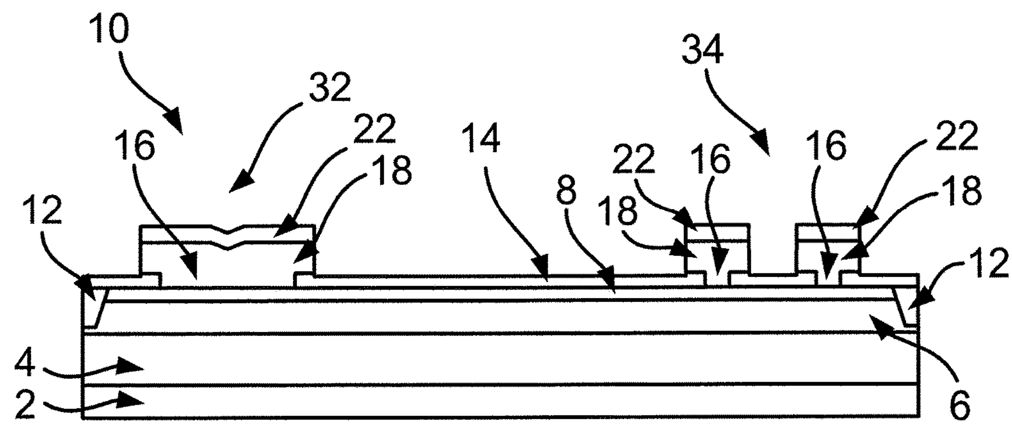
FIGS. 5A to 5D show a method of making a semiconductor device according to a further embodiment of this disclosure.

In a first step, as shown in FIG. 5A, the method may include providing a substrate 2. The substrate 2 may be of the kind described above in relation to FIGS. 1 to 4.

The substrate 2 may, for instance, be a silicon substrate, although it is also envisaged that the substrate 2 may comprise a ceramic or glass. The substrate 2 has an AlGaN layer 8 located on a GaN layer 6. A number of buffer layers 4 comprising e.g. GaN and AlGaN may be located between the GaN layer and the underlying part of the substrate 2. As noted previously, these buffer layers 4 may form a super lattice that matches the lattice of the GaN layer 6 to underlying part of the substrate 2. In some examples, a GaN cap layer may be located on the AlGaN layer 8 (not shown in the Figures). In the present example, isolation regions 12 (e.g. trenches filled with dielectric or implanted regions) are provided for isolating the HEMT from other electrical devices on the substrate 2.

A dielectric layer 14 may be deposited on a major surface of the substrate, e.g. on a surface of the AlGaN layer 8 or any GaN cap layer that may be provided on the AlGaN layer 8. As noted previously, the dielectric layer 14 may act as a passivation layer. The dielectric layer 14 may comprise, for instance, SiN, SiOx or AlOx.

Next, openings 16 may be formed in the dielectric layer 14. These openings 16 may allow access to the underlying layers, such as the AlGaN layer 8 for the source and drain contacts of the device. The openings 16 may be formed by etching.

After formation of the openings 16, a first electrically conductive material may be deposited and patterned to form the ohmic contact portions 18 of a source contact 32 and a drain contact 34 of the device 10. This step may also include depositing and patterning layers 22 on the source contact 32 and drain contact 34, as described previously. As also noted previously, the first electrically conductive material that forms the ohmic contact portions 18 of the source contact 32 and the drain contact 34 may comprise, for instance, comprise Ti/Al, while the layers 22 of the source contact 32 and the drain contact 34 may, for instance, comprise TiW(N).

Figure 5B:
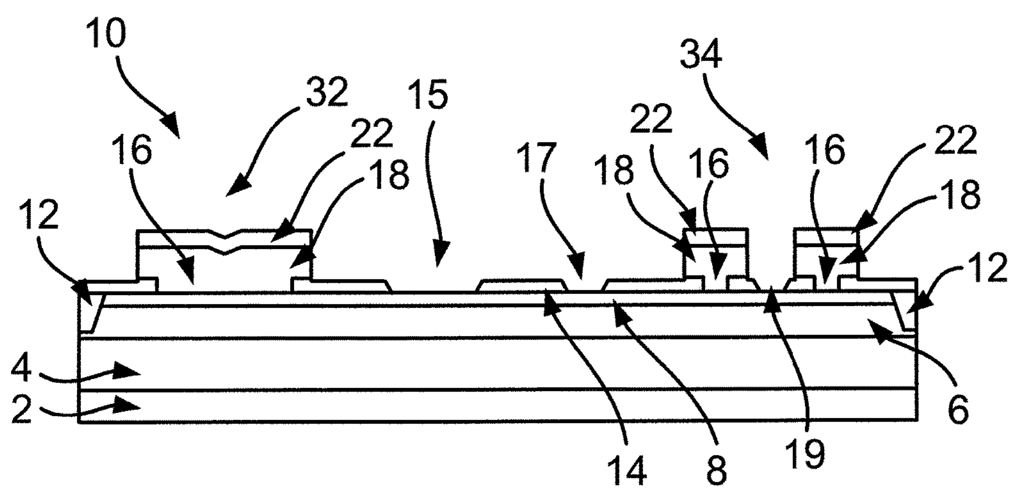

In a next step shown in FIG. 5B, further openings 15, 17 may be formed (e.g. by etching) in the dielectric layer 14. The opening 15 may, as described in relation to previous embodiments, allow a Schottky gate contact of the device 10 to be formed. The opening 15 may be located between the source contact 32 and the drain contact 34 on the major surface of the substrate 2. One or more openings 17 may allow one of more islands to be formed between the gate contact and the drain contact of the device, as described in more detail below.

Figure 5C:
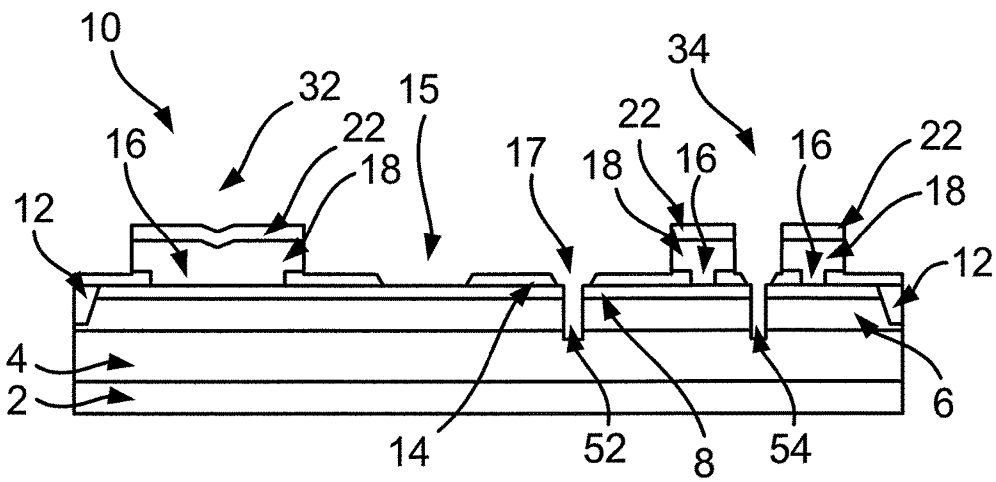

In a next step shown in FIG. 5C, a masking and etching process may be used to form a number of trenches. These trenches may include a trench 54 that extends through the drain contact 34 and into the GaN layer 6 as described above in relation to the preceding embodiments. In the present example, one or more trenches 52 may also be etched through the one or more openings 17 in the dielectric layer 14. The trenches 52 may extend down into the substrate 2 from the major surface thereof in a manner similar to that already described in relation to the trench 54 of the drain contact 34.

Figure 5D:
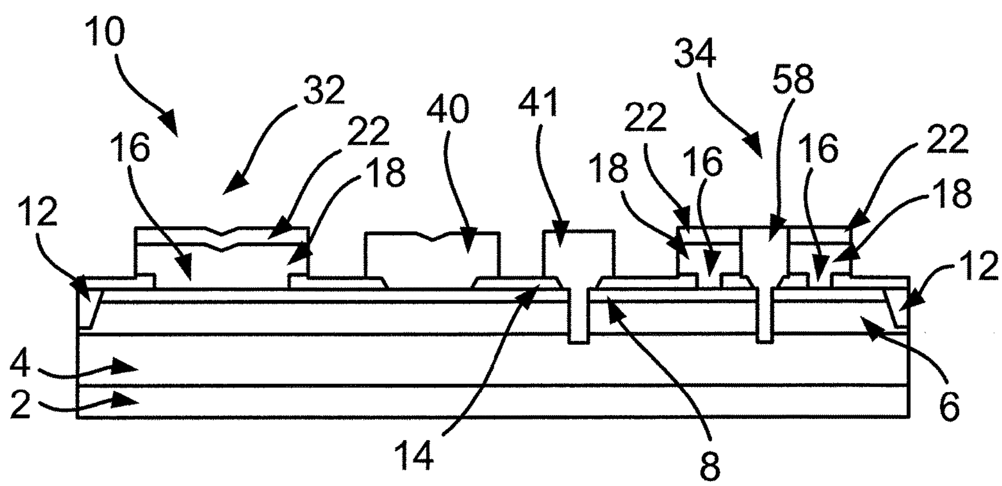

In a next step, a second electrically conductive material may be deposited and patterned, resulting in the device shown in FIG. 5D. In the present example, the second electrically conductive material comprises Ni, although as noted previously, it is envisaged that the second electrically conductive material may comprise, for instance, Pd, Pt or TiW(N).

As can be seen in FIG. 5D, the second electrically conductive material may at least partially fill the trench 54 of the drain contact 34 (as indicated using reference numeral 58 in FIG. 5D), resulting in a drain contact similar to the contacts described above in relation to the earlier embodiments. In some examples, the second electrically conductive material may be provided in the form of a layer that lines the trench 54 as described above in relation to FIG. 2.

Another part of the deposited and patterned second electrically conductive material, which is aligned with the opening 15 in the dielectric layer 14, may form a Schottky gate electrode 40 of the device 10.

A further part of the deposited and patterned second electrically conductive material may at least partially fill each of the one or more trenches 52 described above in relation to FIG. 5C. This may result in the formation of one or more islands 41 located between the gate contact and the drain contact 34, each island including a trench extending down into the substrate 2 from the major surface, with each trench being at least partially filled with the second electrically conductive material. In examples where the second electrically conductive material is provided in the form of a layer as noted above, the layer may also line the trenches 52. The remainder of the trench 54 and/or the trenches 52 may be filled with a third electrically conductive material such as Al.

As may be seen in FIG. 5D, a part of the second electrically conductive material of each island 41 may extend out of the trenches 52 and above the major surface of the substrate 2 (e.g. it may extend over the surface of the dielectric layer 14). The islands 41 may be electrically connected to the drain contact 32.

The islands 41 may provide a further route for holes located in the GaN layer 6 to exit the device 10.

The islands 41 and their associated trenches 52 may, when viewed from above the major surface of the substrate 2 be shaped as dots or stripes. The islands may be arranged in an array. For instance, the array may comprise on or more rows of substantially equally spaced islands.

In each of the examples described above in relation to FIGS. 3 to 5, it is envisaged that the opening 15 in the dielectric layer may be omitted, allowing a MISHEMT to be formed without necessarily requiring any other significant modification of the manufacturing process.

Accordingly, there has been described a semiconductor device and a method of making the same. The device includes a substrate having an AlGaN layer located on a GaN layer for forming a two dimensional electron gas at an interface between the AlGaN layer and the GaN layer. The device also includes a plurality of contacts. At least one of the contacts includes an ohmic contact portion located on a major surface of the substrate. The ohmic contact portion comprises a first electrically conductive material. The at least one of the contacts also includes a trench extending down into the substrate from the major surface. The trench passes through the AlGaN layer and into the GaN layer. The trench is at least partially filled with a second electrically conductive material. The second electrically conductive material is a different electrically conductive material to the first electrically conductive material.

Although particular embodiments of this disclosure have been described, it will be appreciated that many modifications/additions and/or substitutions may be made within the scope of the claims.

The invention claimed is:

1. A semiconductor device comprising:

a High Electron Mobility Transistor (HEMT) comprising a gate contact located between a source contact and a drain contact;

a substrate having an AlGaN layer located on a GaN layer for forming a two dimensional electron gas at an interface between the AlGaN layer and the GaN layer; and a plurality of contacts, wherein at least one contact of the plurality of contacts is the drain contact of the HEMT and comprises:

an ohmic contact portion located on a major surface of the substrate, wherein the ohmic contact portion comprises a first electrically conductive material; and a trench extending down into the substrate from the major surface, wherein the trench passes through the AlGaN layer and into the GaN layer, wherein the trench is at least partially filled with a second electrically conductive material, wherein the second electrically conductive material is a different electrically conductive material than the first electrically conductive material.

2. The semiconductor device of claim 1, wherein the at least one contact includes a central part aligned with the trench, wherein the central part is at least partially filled with the second electrically conductive material, and wherein the central part is substantially surrounded by the ohmic contact portion when viewed from above the major surface.

3. The semiconductor device of claim 2, wherein the second electrically conductive material comprises a single contiguous portion that at least partially fills the central part of the at least one contact and the trench.

4. The semiconductor device of claim 2, wherein the second electrically conductive material comprises a layer that lines at least the trench.

5. The semiconductor device of claim 1, wherein the substrate further includes a GaN cap layer located on the AlGaN layer, and wherein the trench of the at least one contact passes through the GaN cap layer.

6. The semiconductor device of claim 1, comprising at least one island located between the drain contact and the gate contact, wherein each island includes the trench extending down into the substrate from the major surface, wherein the trench passes through the AlGaN layer and into the GaN layer, and wherein the trench is at least partially filled with the second electrically conductive material.

7. The semiconductor device of claim 1, wherein the gate contact of the HEMT comprises the second electrically conductive material.

8. The semiconductor device of claim 1, wherein the first electrically conductive material comprises one or both of an alloy of Ti/Al and/or wherein the second electrically conductive material comprises Ni, Pd, Pt or TiWN.

9. A method of making a semiconductor device of claim 1, the method comprising:

providing a substrate having an AlGaN layer located on a GaN layer for forming a two dimensional electron gas at an interface between the AlGaN layer and the GaN layer; and forming a plurality of contacts of the device, wherein forming at least one drain contact of the plurality of contacts comprises:

depositing a first electrically conductive material on a major surface of the substrate to form an ohmic contact portion;

forming a trench extending down into the substrate from the major surface, wherein the trench passes through the AlGaN layer and into the GaN layer; and at least partially filling the trench with a second electrically conductive material, wherein the second electrically conductive material is a different electrically conductive material to the first electrically conductive material, wherein the semiconductor device comprises a High Electron Mobility Transistor (HEMT) that comprises a gate contact located between a source contact and a drain contact, and the at least one drain contact is the drain contact of the HEMT.

10. The method of claim 9, comprising:

removing at least part of the first electrically conductive material of the at least one contact to form an opening in the ohmic contact portion, wherein the opening exposes a part of the major surface;

forming the trench in the part of the major surface exposed by the opening in the ohmic contact portion; and at least partially filling the trench and the opening in the ohmic contact portion with said second electrically conductive material.

11. The method of claim 10, wherein the part of the first electrically conductive material of the at least one contact that is removed to form said opening in the ohmic contact portion comprises a central part of said contact, and wherein after said at least partially filling the trench and the opening in the ohmic contact portion with said second electrically conductive material, the central part is substantially surrounded by the ohmic contact portion when viewed from above the major surface.

12. The method of claim 9, further comprising forming at least one island located between the drain contact and the gate contact by:

forming one or more trenches extending down into the substrate from the major surface, wherein each trench passes through the AlGaN layer and into the GaN layer; and at least partially filling each trench with said second electrically conductive material.

13. A semiconductor device comprising:

a Schottky diode comprising a cathode and a gate contact of an anode;

a substrate having an AlGaN layer located on a GaN layer for forming a two dimensional electron gas at an interface between the AlGaN layer and the GaN layer; and a plurality of contacts, wherein at least one contact of the plurality of contacts is the cathode of the Schottky diode and comprises:

an ohmic contact portion located on a major surface of the substrate, wherein the ohmic contact portion comprises a first electrically conductive material; and a trench extending down into the substrate from the major surface, wherein the trench passes through the AlGaN layer and into the GaN layer, wherein the trench is at least partially filled with a second electrically conductive material, wherein the second electrically conductive material is a different electrically conductive material than the first electrically conductive material, and wherein the gate contact of the anode of the Schottky diode comprises the second electrically conductive material.

* * * * *